United States Patent
Nakazawa et al.

(10) Patent No.: US 6,429,043 B1
(45) Date of Patent: Aug. 6, 2002

(54) SEMICONDUCTOR CIRCUITRY DEVICE AND METHOD FOR MANUFACTURING THE SAME

(75) Inventors: Taibo Nakazawa; Koki Hirasawa, both of Tokyo (JP)

(73) Assignee: NEC Corporation, Toyko (JP)

( * ) Notice: Subject to any disclaimer, the term of this patent is extended or adjusted under 35 U.S.C. 154(b) by 0 days.

(21) Appl. No.: 09/566,390

(22) Filed: May 8, 2000

(30) Foreign Application Priority Data

May 7, 1999 (JP) .......................................... 11-127829

(51) Int. Cl.[7] .............................................. H01L 21/44
(52) U.S. Cl. ....................... 438/106; 438/113; 438/108; 438/112; 438/127; 438/129; 257/778; 257/780; 257/783; 257/787; 257/728
(58) Field of Search ................................ 438/106, 108, 438/112, 127, 129, 113; 257/701, 737, 738, 778, 780, 787, 795

(56) References Cited

U.S. PATENT DOCUMENTS

| | | | |
|---|---|---|---|
| 5,350,947 A | * | 9/1994 | Takekawa et al. .......... 257/702 |
| 5,518,964 A | * | 5/1996 | DiStefano et al. .......... 438/113 |
| 6,117,694 A | * | 9/2000 | Smith et al. .................. 438/14 |
| 6,291,897 B1 | * | 9/2001 | Wark et al. ................. 257/786 |

FOREIGN PATENT DOCUMENTS

| | | |
|---|---|---|
| JP | 5-47958 | 2/1993 |
| JP | 8-97399 | 4/1996 |
| JP | 9-17916 | 1/1997 |
| JP | 9-162348 | 6/1997 |
| JP | 9-219421 | 8/1997 |
| JP | 10-256427 | 9/1998 |
| JP | 10-335528 | 12/1998 |
| JP | 11-17054 | 1/1999 |

OTHER PUBLICATIONS

Pub. No: US 2002/0009827 A1, Beroz et al. Jan. 24, 2002.*

* cited by examiner

Primary Examiner—Caridad Everhart
Assistant Examiner—Belur Keshavan
(74) Attorney, Agent, or Firm—Young & Thompson

(57) ABSTRACT

A compact semiconductor circuitry device capable of providing a high production efficiency and of shortening time required for packaging and a method for manufacturing a same are provided. A terminal supplying tape having a metal thin film member mounted, on a base material film, in a same arrangement pattern as for a chip terminal of a semiconductor chip and in a state in which it can be peeled off, is prepared in advance. The terminal supplying tape and the semiconductor chip are so disposed as to face each other. The metal thin film member of the terminal supplying tape is connected to the chip terminal, with the terminal supplying tape remaining fixed on the base material film. Then, the base material film is peeled off. An underfill is mounted as necessary. A resin molded portion is also mounted.

5 Claims, 8 Drawing Sheets

*cross sectional view taken along line A-A*

21a ;terminal supplying tape
23a ;metal thin film member
22a ;base material film 23a ;metal thin film member
22a ;base material film cross-sectional view
taken along line B-B

SEMICONDUCTOR CIRCUITRY DEVICE AND METHOD FOR MANUFACTURING THE SAME

BACKGROUND OF THE INVENTION

1. Field of the Invention

The present invention relates to a semiconductor circuitry device packaging a semiconductor chip and a method for manufacturing a same.

2. Description of the Related Art

In general, a semiconductor device is used in a state where it is encapsulated in a package in consideration of its use environments, packaging characteristics on a substrate or a like. Various types of packages are available depending upon sizes of semiconductor devices, a number of terminals or a like. For example, if the semiconductor device has many terminals, a BGA (Ball Grid Array) package in which terminals are mounted at a lower side face of the package in a lattice-like configuration or an LGA (Land Grid Array) package is employed in many cases.

One example of a process of encapsulating semiconductor chips in such kinds of packages will be described below by referring to FIGS. 10A to 10G.

First, a lead frame 111 is provided (FIG. 10A). The lead frame 111 is generally composed of low-cost Cu (copper) metal. Then, a recess 112 is formed in the lead frame 111 at a predetermined place by half-etching (FIG. 10B). The recess 112 is formed at a place where an external terminal of a package is mounted. Then, plating is performed on an inside face of the recess 112 (FIG. 10C). A plated layer 113 formed by this process serves as the external terminal 117 in a finished package. As described later, it is necessary for the external terminal to have various characteristics including its applicability to a wire bonding, its ability to prevent tin contained in a solder from being diffused, its wettability to soldering or a like. To meet such requirements, the plated layer 113 is constructed so as to be multi-layered, for example, in four layers composed of Pd/Ni/Pd/Au (Palladium/Nickel/Palladium/Gold). Then, a chip 101 is mounted with an insulating adhesive at a predetermined place on the half-etched side of the lead frame 111 (FIG. 10D). In the example shown in FIG. 10D, the chip 101 is mounted face up. After a stud bump 115 required to ensure flatness is formed on the plated layer 113, a connection between the stud bump 115 and the chip terminal 102 is established using a wire 114 (i.e., the wire bonding is carried out) (FIG. 10E).

Then, the chip 101, wire 114 or a like are formed in one piece of resin 116 for encapsulation. This causes the chip 101 or the like to be covered by resin 116 (FIG. 10F). At a last stage, the lead frame 111 is totally removed by etching. At this point, however, the plated layer 113 is not removed by the etching. After the lead frame 111 is removed by the etching, the plated layer 113 serves as the external terminal 117 of the package (FIG. 10G) The external terminal 117 (the plated layer 113) is firmly bonded to the stud bump 115 formed on a rear side of the stud bump 115. The stud bump 115 itself is fixed by a resin mold, preventing the external terminal 117 from being peeled off.

Examples of such technologies of encapsulating semiconductor devices are disclosed in Japanese Laid-open Patent Application Nos. Hei9-162348 and Hei11-17054. Japanese Laid-open Patent Application No. Hei8-97399 is a technology in which a pillar-shaped conductor is mounted on a semiconductor chip.

However, such conventional technologies as disclosed in the above Japanese Laid-open Patent Application No. Hei9-162348 have a problem in that time required for manufacturing the semiconductor circuitry device is too lengthened, resulting in a decreased efficiency in its production. Time required for etching the lead frame, in particular, is a problem. Moreover, a formation of the stud bump is necessary in the conventional technologies, which causes the wire bonding to require much time. Though there is a remarkable tendency that a size of the package is being made smaller in this field recently, the conventional technologies are not successful in miniaturizing the package. The portion of the wire bonding in particular is an obstacle to the miniaturization of the package.

Moreover, the technology disclosed in Japanese Laid-open Patent Application No. Hei8-97399 requires that the pillar-like conductor is formed in the semiconductor chip, which is, however, difficult to be implemented technologically. Even if it were to be implemented, it is inevitable that a cost of a product would rise too much.

SUMMARY OF THE INVENTION

In view of the above, it is an object of the present invention to provide a compact semiconductor circuitry device capable of providing a high production efficiency and a method for manufacturing a same.

According to a first aspect of the present invention, there is provided a semiconductor circuitry device used by being connected to a connecting terminal section of other device including:

a semiconductor chip on a surface of which a circuit and an internal terminal are formed; and an external terminal whose package connecting face to be connected to the connecting terminal section of the other device is mounted directly below the internal terminal.

By configuring as described above, it is possible to make the semiconductor circuitry device compact.

In the foregoing, a preferable mode is one that wherein further includes a bump mounted between the internal terminal and the external terminal used to connect the external terminal to the internal terminal.

By using the bump described above, the semiconductor circuitry device can be made smaller in size.

Also, a preferable mode is one that wherein further includes a resin portion formed, at least, on a surface of the bump and in an area surrounding the bump.

In some cases, a stress caused by connecting procedures remains in the bump and in an area surrounding the bump, which may cause breakage in a connection portion including the bump.

By mounting the resin portion described above, the stress can be relieved, thus preventing such breakage.

Also, a preferable mode is one wherein the package connecting face of the external terminal is disposed outside of the resin portion or the package connecting face conforms positionally to an outer face of the resin portion.

By configuring above, a connection with the connecting terminal of other device can be easily achieved. However, if high reliability in strength or a like is not required at a connecting point with the connecting terminal of other device, the package connecting face is allowed to confirm positionally to the outer face of the resin portion.

Also, a preferable mode is one that wherein a coated portion covers a side of the semiconductor chip on which the circuit is not mounted.

By configuring above, the semiconductor circuitry device can be resistant to various use environments.

Also, a preferable mode is one wherein the bump mounted between the internal terminal and the external terminal contains Au (Gold) or PbSn (Lead/Tin).

Also, a preferable mode is one that wherein includes a bump for packaging used to connect the package connecting face of the external terminal to the connecting terminal section of the other device.

Furthermore, a preferable mode is one wherein the bump for packaging is formed so as to be almost spherical.

According to a second aspect of the present invention, there is provided a method for manufacturing the semiconductor circuitry device having a semiconductor chip on a surface of which a circuit and an internal terminal are formed and having an external terminal connected to the internal terminal, including the steps of:

connecting a conducive material, which serves as the external terminal, fixed to a base material in a same pattern as for the internal terminal and in a state where the base material is able to be peeled off, to the internal terminal of the semiconductor chip while the conductive material is being attached on the base material; and peeling the base material away from the conductive material after the conductive material is connected to the internal terminal of the semiconductor chip.

By employing the step of peeling the base material away from the conductive material, a package connecting face is put in an exposed state, allowing the conductive material to function as the external terminal.

In the foregoing, a preferable mode is one that wherein includes the steps of:

fixing the conductive material to the base material in a state where the package connecting face to be connected to a connecting terminal section of other device is covered with the base material; and forming a resin portion which covers, at least, the connecting portion between the internal terminal and the conductive material and an area surrounding the connecting portion after the conductive material is connected to the internal terminal of the semiconductor chip and before the base material is peeled away from the conductive material.

By employing the above step, adherence of the resin to the package connecting face can be prevented.

Also, a preferable mode is one that wherein includes a step of forming the resin portion which covers, at least, the connecting portion between the internal terminal and the conductive material and the area surrounding the connecting portion so that a part of a side of the conductive material is covered with the base material after the conductive material is connected to the internal terminal of the semiconductor chip and before the base material is peeled away from the conductive material.

Also, a preferable mode is one that wherein includes a step of forming the resin portion which covers, at least, the connecting portion between the internal terminal and the conductive material and the area surrounding the connecting portion by using a lower die having a recess with a depth being smaller than a thickness of the conductive material at a place where the conductive material contacts the base material after the conductive material is connected to the internal terminal of the semiconductor chip and before the base material is peeled away from the conductive material.

By employing above steps, when a coating process using a resin mold is performed at a later stage, existence of the recess allows the package connecting face to be disposed outside of the resin portion.

Also, a preferable mode is one that wherein includes a step of covering a side where a circuit is not mounted in the semiconductor chip with a coating material.

By employing this step, environment-resistance of the semiconductor circuitry device is improved and the semiconductor circuitry device is resistant to various use environments.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

Embodiment

Configurations of a semiconductor circuitry device of an embodiment of the present invention will be described by referring to FIGS. 1 to 9.

Figure 1:
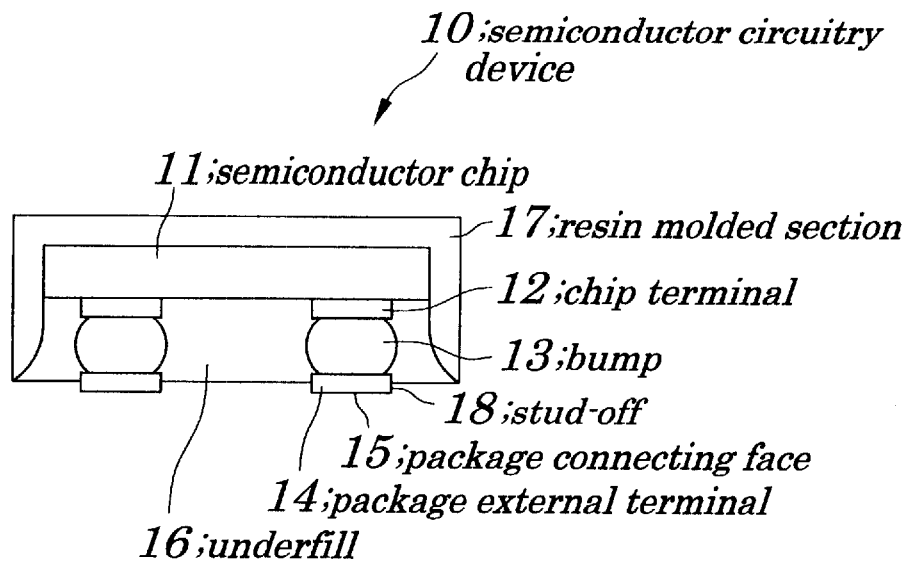
FIG. 1 is a cross-sectional view showing internal configurations of a semiconductor circuitry device according to an embodiment of the present invention.
Figure 2:
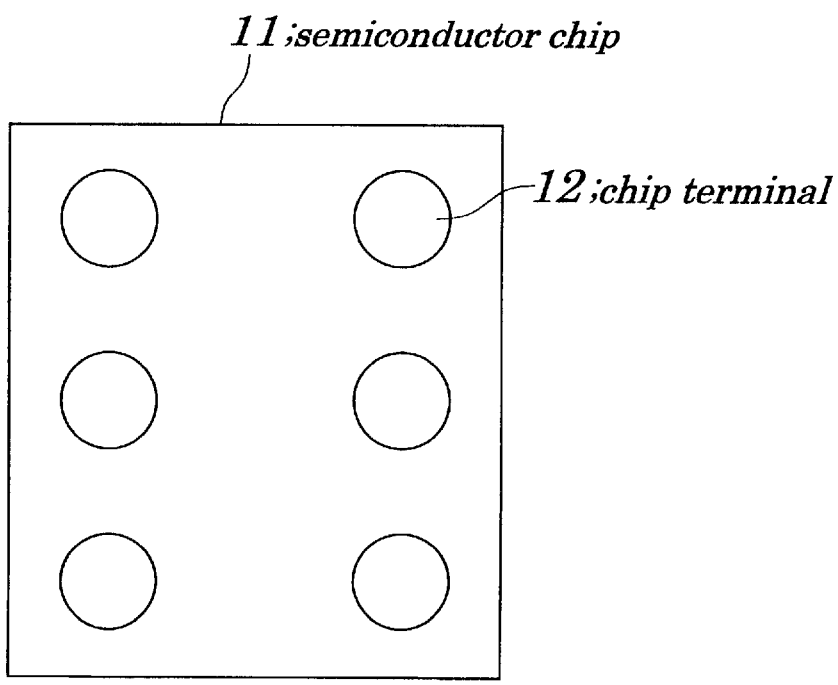
FIG. 2 is a diagram showing an arrangement of a chip terminal of the semiconductor circuitry device according to the embodiment of the present invention.
Figure 3A:
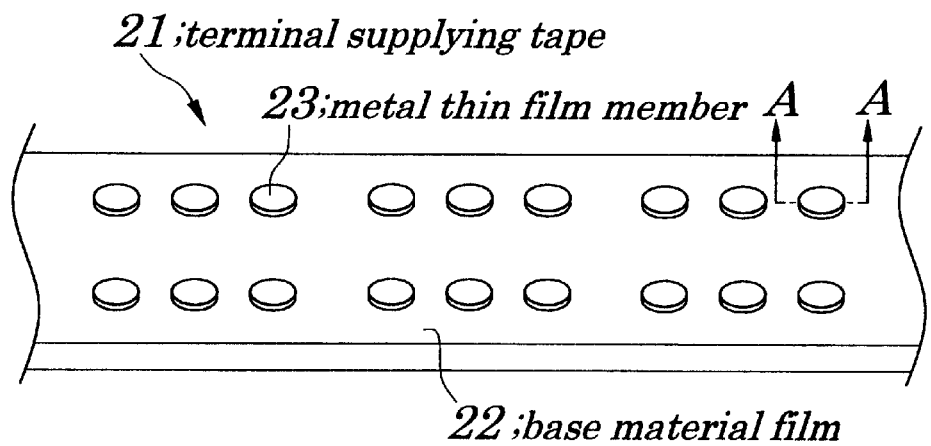
FIG. 3A is a perspective view showing a terminal supplying tape of the semiconductor circuitry device according to the embodiment of the present invention.
Figure 3B:
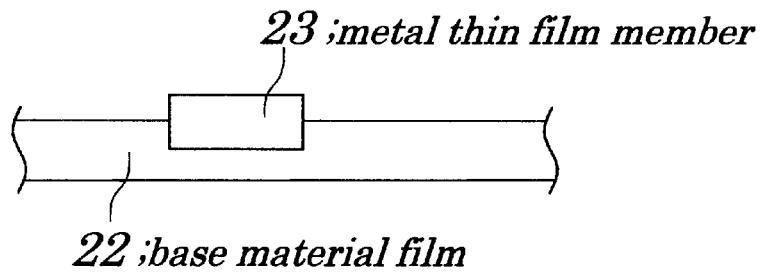
FIG. 3B is a partial cross-sectional view of the terminal supplying tape of FIG. 3A taken along the line A—A.
Figure 4A:
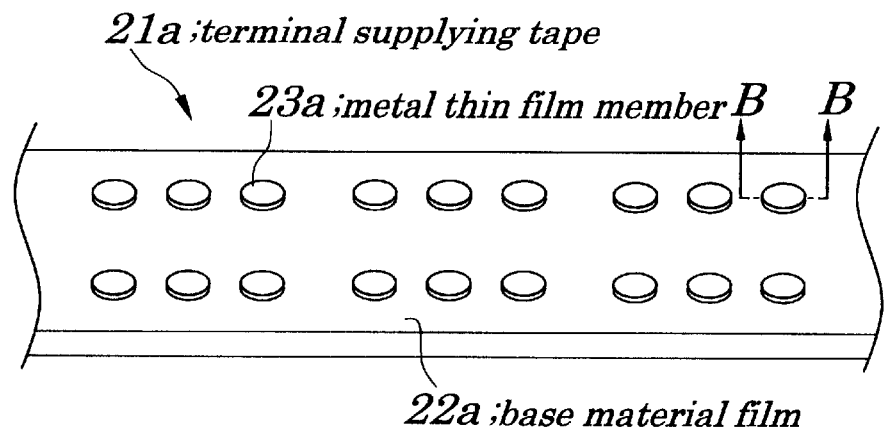
FIG. 4A is a perspective view showing another example of the terminal supplying tape of the semiconductor circuitry device according to the embodiment of the present invention.
Figure 4B:
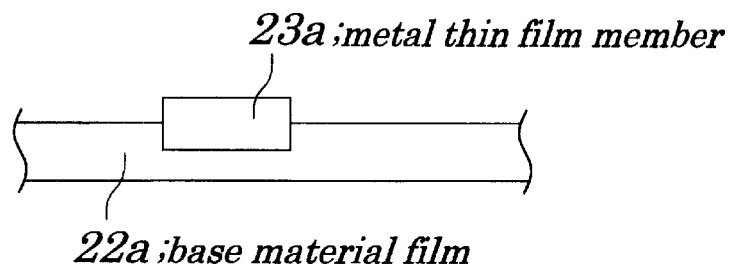
FIG. 4B is a partial cross-sectional view of the terminal supplying tape of FIG. 4A taken along the line B—B.
Figure 6:
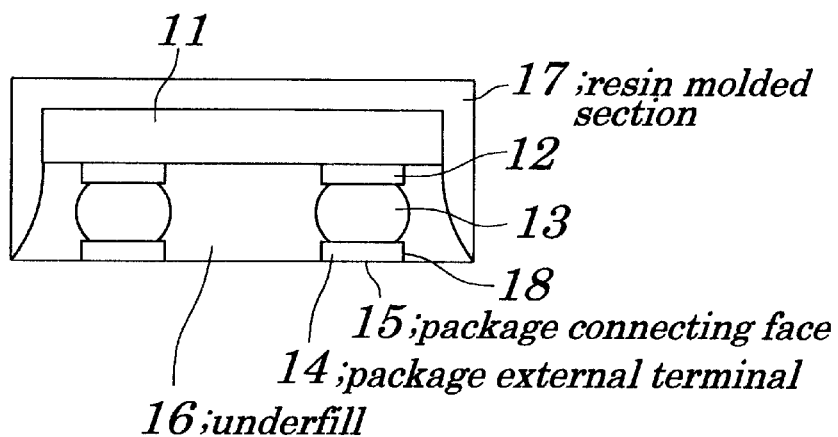
FIG. 6 is a cross-sectional view showing internal configurations of a modified example of the semiconductor circuitry device according to the embodiment of the present invention.
Figure 7:
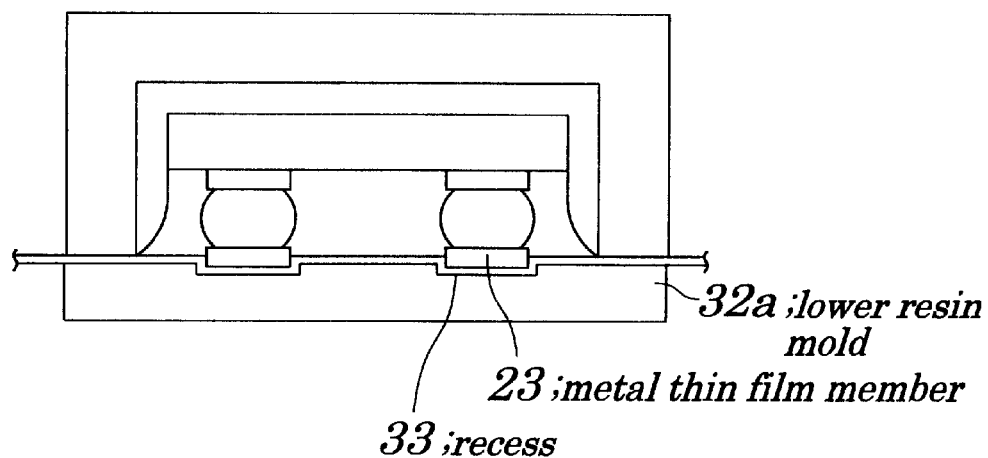
FIG. 7 is a diagram showing a part of production processes of the modified example of the semiconductor circuitry device according to the embodiment of the present invention.
Figure 8:
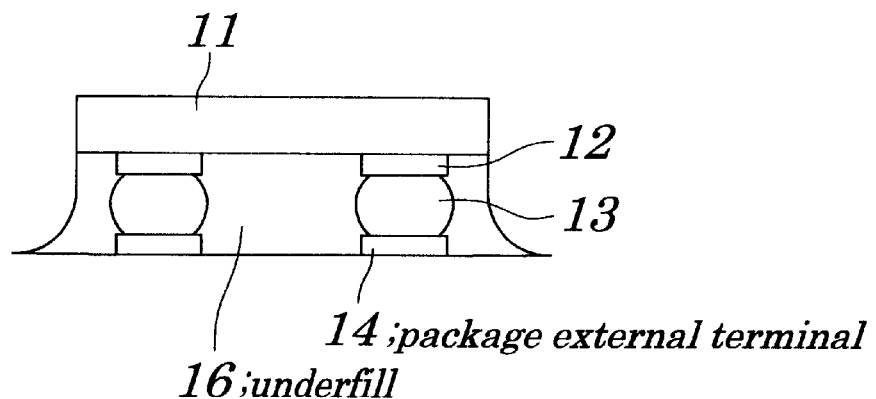
FIG. 8 is a cross-sectional view showing internal configurations of the semiconductor circuitry device according to the embodiment of the present invention.
Figure 9:
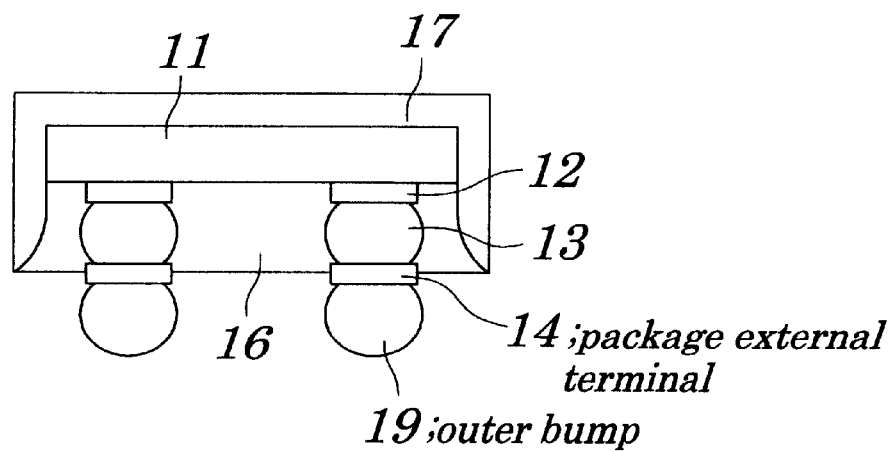
FIG. 9 is a cross-sectional view showing internal configurations of a third modified example of the semiconductor circuitry device according to the embodiment of the present invention.
Figure 10A:
FIGS. 10A to 10G are process diagrams showing a conventional process of encapsulating a semiconductor chip.
Figure 10B:
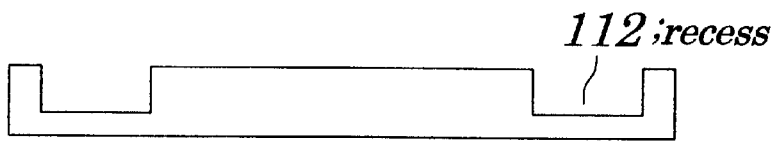
Figure 10C:
Figure 10D:
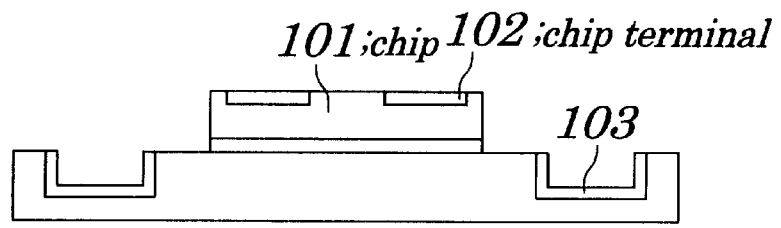
Figure 10E:
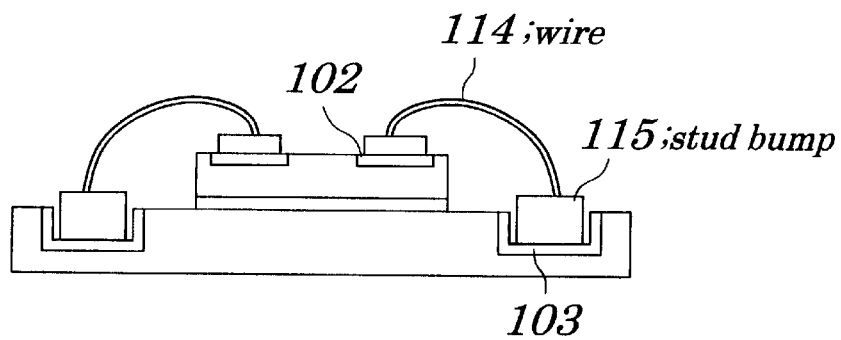
Figure 10F:
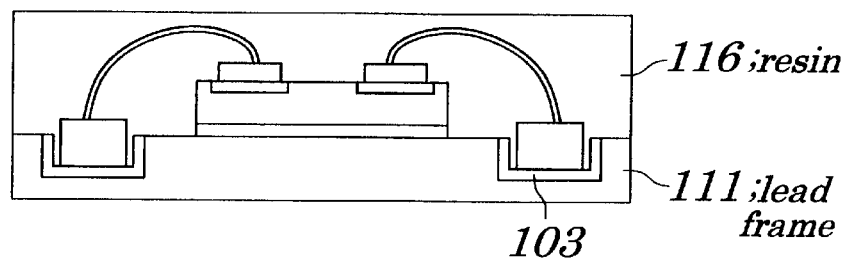
Figure 10G:
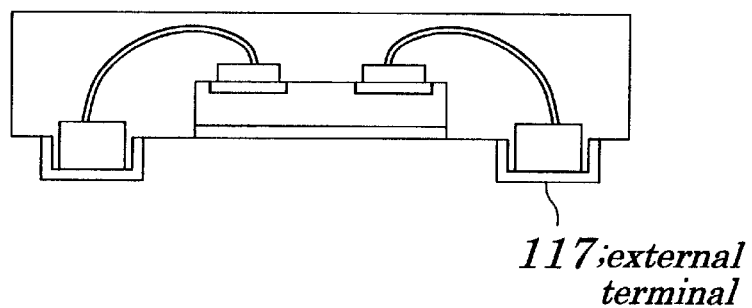

FIG. 1 is a cross-sectional view schematically showing internal configurations of the semiconductor circuitry device according to the embodiment of the present invention. FIG. 2 is a diagram showing an arrangement of a chip terminal of the semiconductor circuitry device according to the embodiment. FIG. 3A is a perspective view showing a terminal supplying tape of the semiconductor circuitry device according to the embodiment and FIG. 3B is a partial cross-sectional view of the terminal supplying tape of FIG. 3A taken along the line A—A. FIG. 4A is a perspective view showing another example of the terminal supplying tape of the semiconductor circuitry device according to the embodiment and FIG. 4B is a partial cross-sectional view of the terminal supplying tape of FIG. 4A taken along the line B—B. FIGS. 5A to 5E are diagrams illustrating production processes of the semiconductor circuitry device according to the embodiment. FIG. 6 is a cross-sectional view schematically showing internal configurations of a modified example of the semiconductor circuitry device according to the embodiment. FIG. 7 is a diagram showing a part of production processes of the modified example of the semiconductor circuitry device according to the embodiment. FIG. 8 is a cross-sectional schematically showing internal configurations of the semiconductor circuitry device according to the embodiment. FIG. 9 is a cross-sectional view schematically showing internal configurations of a third modified example of the semiconductor circuitry device according to the embodiment.

In configurations of the semiconductor circuitry device of this embodiment, a connection between a chip terminal of a semiconductor chip and an external terminal of a package is made in accordance with a flip-chip method. Its detailed description is given below. Moreover, in the present application, terms of "upper" and "lower" are used. These terms indicate a relative positional relation among components and not an absolute positional relation in the upper or lower direction among components of the semiconductor circuitry device.

Detailed configurations of the semiconductor circuitry device of this embodiment will be described by referring to FIGS. 1 and 2. As shown in FIG. 1, a semiconductor circuitry device 10 is constructed by LGP-packaging a semiconductor chip 11 in which various circuits such as transistors or a like are formed.

The semiconductor circuitry device 10 is composed of the semiconductor chip 11, a bump 13, a package external terminal 14, an underfill 16 and a resin molded section 17. The semiconductor chip 11 is composed of various circuits such as transistors or the like formed on a chip substrate made of silicon or a like. As shown in FIG. 2, on a side of the semiconductor chip where such various circuits are attached is formed a chip terminal 12 in a predetermined arrangement pattern. The semiconductor chip 11 is packaged with a face having the chip terminal 12 directed toward a side on which the package external terminal 14 is mounted, in a "face-down" manner. A material for an outermost layer of a chip terminal 12 may be, for example, Au (Gold) or Al (Aluminum) Moreover, in example shown in FIG. 2, the chip terminals 12 each having a diameter of 0.1 mm are arranged at a 0.2 mm pitch in a lattice-like form.

The bump 13 is mounted on a surface of the chip terminal 12 (on a lower side in the drawing) in order to connect the chip terminal 12 to the package external terminal 14. So long as this aim is achieved, no limitation is imposed on a shape, internal structure, material or a method of production. For example, any one of bumps including a stud bump, ball bump, plate bump or solder bump may be used. For example, Au or PbSn (Lead/Tin) may be used as the material for the bump 13.

The package external terminal 14 is used to connect the semiconductor circuitry device to a substrate of other circuits when this semiconductor circuitry device is mounted. According to this embodiment, the package external terminal 14 is disposed directly below the chip terminal 12 and its arrangement patterns conform completely to those of the chip terminal 12 (see FIG. 2) The package external terminal 14 is connected to the chip terminal 12 through the bump 13, in the flip-chip configuration. Moreover, a package connecting face 15 of the package external terminal 14 is disposed directly below the chip terminal 12. The package connecting face 15 is a portion to be connected to a terminal (or a bump connected to the terminal) mounted on other circuit devices, packaged substrates or a like. By applying such connecting configurations, a wiring length between the chip terminal 12 and the package external terminal 14 can be made very short. A volume of the package is also made very small.

Such materials including, for example, Au, Au/Pd/Au, SnAg (Tin/Silver), SnBi (Tin/Bismuth), SnZn (Tin/Zinc) and SnIn (Tin/Indium) may be used for the package external terminal 14. Moreover, the package external terminal 14 is so configured as to be extruded slightly outside from an outer face of the package (outside face of the underfill 16) to provide better packaging properties. The underfill 16 is mounted in order mainly to relieve internal stress at a connection portion of the chip terminal 12, bump 13 and package external terminal 14 and to prevent damage at the connection portion. Resin (for example, silicone resin) forms a principal constituent of the underfill 16. According to the embodiment, the underfill 16 is mounted on overall faces on the lower side of the semiconductor circuitry device 10 as shown in FIG. 1.

The resin molded section 17 is mounted to protect these semiconductor chips 11 and is constructed so as to cover an upper side and a side face of the semiconductor circuitry device 10. The resin molded section 17 is integrally formed by resin as described later.

Next, a method for manufacturing the semiconductor circuitry device 10 will be described below.

First, an explanation of a terminal supplying tape 21 to be prepared prior to packaging processes will be given by referring to FIGS. 3A and 3B. The terminal supplying tape 21 is supplied while the package external terminal 14 is being manufactured.

As shown in FIGS. 3A and 3B, the terminal supplying tape 21 is composed of a base material film 22 made of resin and metal thin film members 23 fixed on the base material film 22 having conductivity in a predetermined pattern to be used as the package external terminal 14 in a final product. Arrangement pattern of the metal thin film member 23 on the base material film 22 is adapted to conform to that of the chip terminal 12 of the semiconductor chip 11 to be packaged. As shown in FIG. 3B and FIG. 4B, a portion serving as the package connecting face 15 of the metal thin film member 23 (a portion to be connected to a terminal of a packaging substrate while the semiconductor circuitry device 10 is mounted on other packaging substrate) is covered with the base material film 22 or a part of a metal thin film member 23a is covered with abase material film 22a. Bonding stress (adhesive or tacky powder) between the metal thin film member 23 and the base material film 22 is adjusted so that it does not cause any damage to the metal thin film member 23 and that the base material film 22 can be peeled away from the metal thin film member 23. In the example in FIGS. 3A and 3B, the metal thin film member 23 is mounted on the base material film 22 in a same arrangement pattern as that for the chip terminal 12.

The base material film 22 that may be used includes polyester film, polymethylpenten film, polyimide film or a like. However, no limitation is imposed on material so long as it has heat resistance and strength that can withstand exposure to high temperature and high pressure occurring at a time of resin molding and it has a peel strength to the resin used for encapsulation and the underfill 16. On the other hand, a material for the metal thin film member 23 is decided in consideration of a bonding property to the bump 13, its workability or a like.

Since technology of the terminal supplying tape 21 is well known, a further detailed description is not made. Technologies of supplying a metal foil using a tape and of molding a resin together with a tape are disclosed in, for example, Japanese Laid-open Patent Application No. Hei9-162215.

Next, processes of the packaging will be explained by referring to FIGS. 5A to 5E. Let it be presumed that the bump 13 has been formed in advance on the chip terminal 12 in the production process of the semiconductor chip 11.

Process 1

Figure 5A:
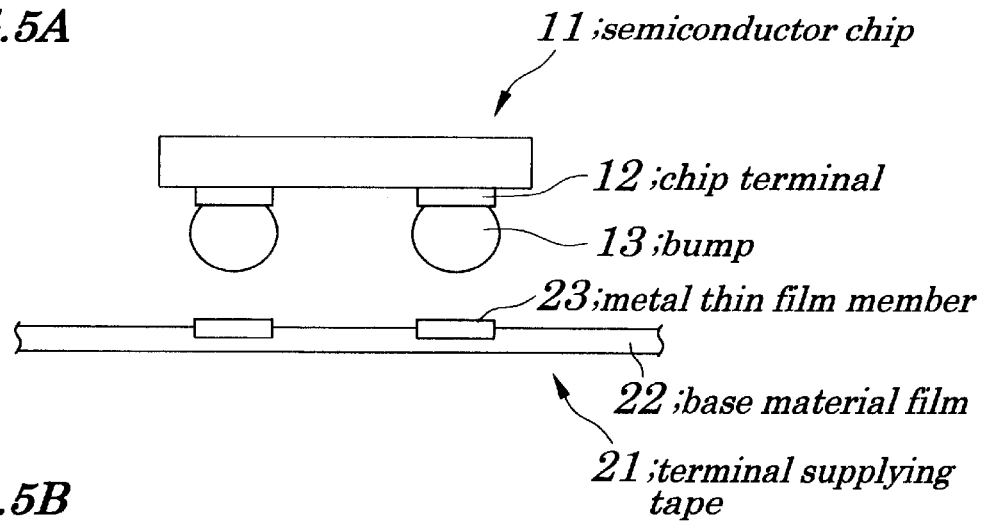
FIGS. 5A to 5E are diagrams illustrating production processes of the semiconductor circuitry device according to the embodiment of the present invention.
Figure 5B:
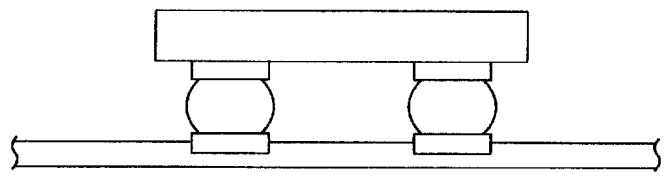

The bump 13 of the semiconductor chip 11 is bonded to the metal thin film member 23 formed on the terminal supplying tape 21 (FIGS. 5A and 5B). First, positioning between the bump 13 and the metal thin film member 23 is made so that they can face directly each other (FIG. 5A). Then, they are bonded by an ultrasonic thermocompression method (FIG. 5B). In consideration of bending or warp in the terminal supplying tape 21, it is desirable that they are bonded with the terminal supplying tape 21 faced down and the semiconductor chip 11 faced up as shown in FIG. 5A.

Process 2

Figure 5C:
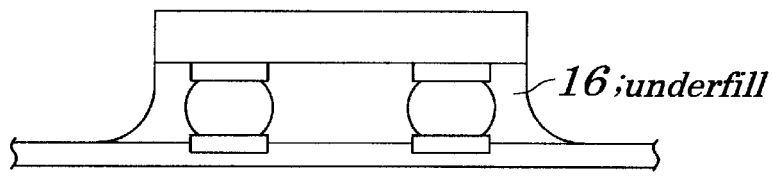

The underfill 16 is formed in areas surrounding the chip terminal 12 and the bonded portion of the bump 13 with the package external terminal 14 (FIG. 5C). Space between the semiconductor chip 11 and the base material film 22 is filled with liquid resin and is then set, in a state where the terminal supplying tape 21 is being mounted. Since the base material film 22 is not yet peeled off at this stage, the lower side face (a portion to function as the package connecting face) of the metal thin film member 23 or a part of the side of the metal film member 23 is covered with the base material film 22. Therefore, even if the space between the semiconductor chip 11 and the base material film 22 is filled with the resin, it does not occur that an overall portion of the package connecting face 15 is fully covered with the resin.

When the semiconductor chip 11 is seen from above, the base material film 22 extends over the semiconductor chip 11. Accordingly, if procedures provided by the above Process 1 are carried out in a state where the terminal supplying tape 21 is disposed downward, this base material film 21 can receive the resin. As a result, the filling of the resin can be performed without reversing the semiconductor chip 11 so as to face upward. Moreover, the base material film 21 allows an outer side face of the underfill 16 (an outer face of the package) to be formed so as to be flat.

Process 3

Figure 5D:
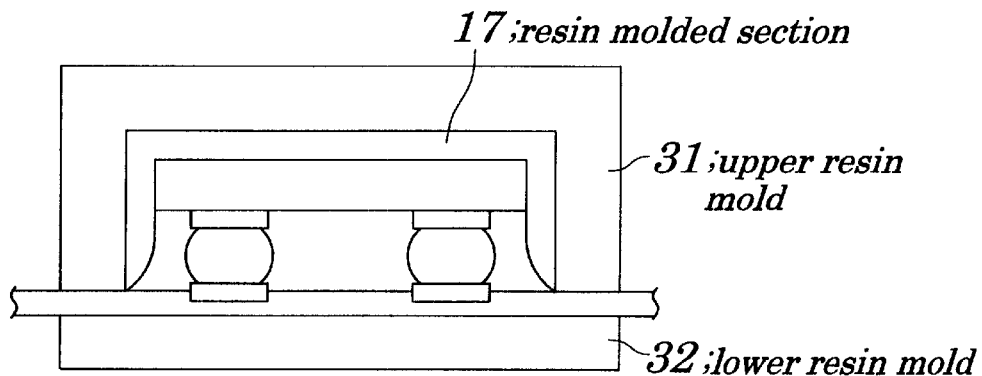

The semiconductor chip 11 is encapsulated with the resin (FIG. 5D). That is, the semiconductor chip 11 is housed together with the terminal supplying tape 21 into a cavity formed by an upper resin mold 31 and a lower resin mold 32. By filling the cavity with the resin, these components are resin-encapsulated. After the resin encapsulation, they are taken out from the upper and lower resin molds 31 and 32.

Process 4

Figure 5E:
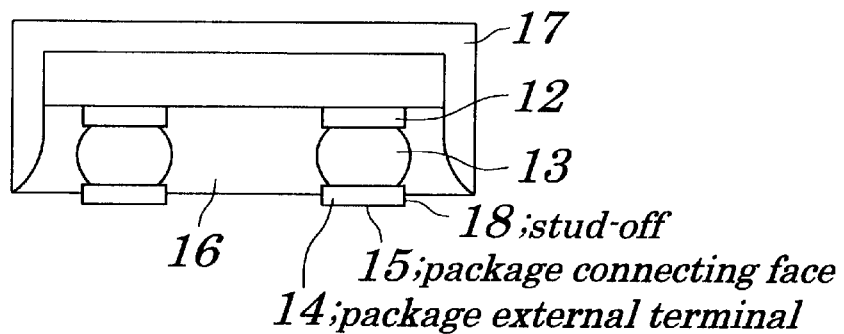

The base material film 22 is peeled away from the metal thin film member 23 (FIG. 5E). The base material film 22 can be easily peeled away by simply pulling it. The metal thin film member 23 exposed by the above procedure serves as the package external terminal 14. A part (called a "stud-off") of the metal thin film member 23 buried in the base material film 22 is slightly extruded from the outer side face of the package. Since a rear side of the package external terminal 14 (the metal thin film member 23) is bonded to the bump 13, peeling does not occur. Thus, the semiconductor circuitry device 10 of the embodiment is produced.

As described above, in the semiconductor circuitry device 10 according to the embodiment of the present invention, since the package substrate (an interposer) is not required, it is possible to make the semiconductor circuitry device compact and low-priced.

Furthermore, since the flip-chip method is employed for the connection between the chip terminal 12 and the metal thin film member 23 (the package external terminal 14), the package external terminal 14 is disposed directly below the chip terminal 12 (through the bump 13). Since the bump 13 is the only component that is interposed between the package external terminal 14 and the chip terminal 12, wiring length is made small, enabling the semiconductor circuitry device to be compact. Due to its small wiring length, the semiconductor circuitry device can be applied to semiconductor devices operating at higher frequencies.

In general, the face-down type package, because a heat spreader can be mounted on a rear side of the semiconductor chip, is more advantageous in terms of heat radiation effect, compared with the face-up type package. Additionally, the semiconductor circuitry device is not provided with the package substrate (the interposer), thus allowing easy heat radiation from the surface of the semiconductor chip. That is, the semiconductor circuitry device being excellent in heat radiation is provided.

The semiconductor circuitry device according to the embodiment of the present invention has also the following advantages in terms of its production. That is, since the flip-chip method is employed for the connection between the chip terminal 12 and the metal thin film member 23 (the package external terminal 14), a formation of the stud bump is not required at a time of packaging, thus enabling time required for manufacturing the semiconductor circuitry device to be shortened. The mounting of the package external terminal 14 is achieved basically by only two processes, i.e., by attaching the terminal supplying tape 21 (bonding of the metal thin film member 23) and by peeling the base material film 22. Since a chemical treatment such as etching or a like is not required, time required for the production process is short and production facilities are simple, thus enabling its production cost to be reduced. At a time of forming the underfill 16, the base material film 22 can prevent the resin from covering the overall metal thin film member 23. Since special processing including a repeated mask of the package connecting face 15 of the package external terminal 14 is not required, it is possible to reduce the manufacturing processes and costs.

As described above, according to configurations of the present invention, a compact and low-priced semiconductor circuitry device can be implemented by an easy production method in which a series of production processes can be reduced and time required for manufacturing can be shortened It is apparent that the present invention is not limited to the above embodiments but may be changed and modified without departing from the scope and spirit of the invention. For example, a size, shape and a count of the chip terminals shown in FIG. 2 and its arrangement pattern and pitch may be hanged as necessary. A size, shape and a count of the metal thin film members on the base material film shown in FIGS. 3A and 3B and its arrangement pattern and pitch may be changed as necessary as well. For example, the shape of the chip terminal and metal thin film member may be square.

In the embodiment described above, the package external terminal 14 is so configured as to extrude from the outer face of the package (from the lower face of the underfill 16), however, as shown in FIG. 6, the package connecting face 15 of the package external terminal 14 is so configured as to strictly conform positionally to the outer face of the package (on the lower side of the underfill 16). Such a semiconductor circuitry device 10 can be implemented, in the process 1, by using the terminal supplying tape 21a whose portion functioning as the package connecting face only is covered with the base material film 22a and whose portion functioning as the side face of the metal thin film member 23a is not covered with the metal thin film material (FIGS. 4A and 4B). Also, as shown in FIG. 7, when the package external terminal 14 is extruded from the outer face of the package, the semiconductor circuitry device 10 can be implemented, in the process 3, by using an lower resin mold 32a having a recess 33.

Also, in the semiconductor circuitry device described in the embodiment, a resin molded portion 17 is formed by providing the resin encapsulation, however, as shown in FIG. 8, the resin encapsulation may be omitted depending on expected use environments. Such a semiconductor circuitry device can be implemented by omitting the described process 3. In the semiconductor circuitry device having these configurations, the heat spreader (cooling fin) can be mounted on the rear of the semiconductor chip, thus providing an efficient cooling.

Furthermore, in the semiconductor circuitry device described in the embodiment, an LGA package is used in which a flat package external terminal 14 is mounted almost in a same plane as the outer face of the package, however, as shown in FIG. 9, an outer bump 19 used to connect a terminal of a substrate to be mounted to the package external terminal 14 may be formed outside of the package external terminal 14 as described above. By employing the solder bump as the outer bump, the semiconductor circuitry device is made of a BGA-type. As materials for the outer bump 19, for example, PbSn, SnAg, SnBi, SnZn and SnIn may be used, Also, in the semiconductor circuitry device described in the embodiment, the underfill 16 is mounted on overall areas of the semiconductor chip 12, however, the underfill 16 may be mounted, in principle, only on the connecting portion of the chip terminal 12, bump 13 and external terminal 14.

Additionally, in the semiconductor circuitry device described in the embodiment, the metal thin film member functioning as the package external terminal composed of the terminal supplying tape using the film as the base material is employed, however, any type of material may be used unless it causes inconvenience in the production process. For example, a sheet material or thin plate may be employed.

Finally, the present application claims the priority of Japanese Patent Application No. Hei11-127829 filed on May 7, 1999, which is herein incorporated by reference.

What is claimed is:

1. A method for manufacturing a semiconductor circuitry device having a semiconductor chip on a surface of which a circuit and an internal terminal are formed and having an external terminal connected to said internal terminal, comprising the steps of:

connecting a conducive material, which serves as said external terminal, fixed to a base material in a same pattern as for said internal terminal and in a state where said base material is able to be peeled away from said conductive material, to said internal terminal of said semiconductor chip while said conductive material is being attached on said base material; and peeling said base material away from said conductive material after said conductive material is connected to said internal terminal of said semiconductor chip.

2. The method for manufacturing the semiconductor circuitry device according to claim 1, further comprising the steps of:

fixing said conductive material to said base material in a state where a package connecting face to be connected to a connecting terminal section of other device is covered with said base material; and forming a resin portion which covers, at least, a connecting portion between said internal terminal and said conductive material and an area surrounding said connecting portion after said conductive material is connected to said internal terminal of said semiconductor chip and before said base material is peeled away from said conductive material.

3. The method for manufacturing the semiconductor circuitry device according to claim 2, further comprising a step of forming said resin portion which covers, at least, said connecting portion between said internal terminal and said conductive material and said area surrounding said connecting portion so that a part of a side of said conductive material is covered with said base material after said conductive material is connected to said internal terminal of said semiconductor chip and before said base material is peeled away from said conductive material.

4. The method for manufacturing the semiconductor circuitry device according to claim 2, further comprising a step of forming said resin portion which covers, at least, said connecting portion between said internal terminal and said conductive material and said area surrounding said connecting portion by using a lower die having a recess with a depth being smaller than a thickness of said conductive material at a place where said conductive material contacts said base material after said conductive material is connected to said internal terminal of said semiconductor chip and before said base material is peeled away from said conductive material.

5. The method for manufacturing the semiconductor circuitry device according to claim 1, further comprising a step of covering a side where a circuit is not mounted in said semiconductor chip with a coating material.

* * * * *